United States Patent [19]

Whitman

[11] Patent Number: 5,572,666

[45] Date of Patent: Nov. 5, 1996

[54] SYSTEM AND METHOD FOR GENERATING PSEUDO-RANDOM INSTRUCTIONS FOR DESIGN VERIFICATION

[75] Inventor: Jeffrey D. Whitman, San Jose, Calif.

[73] Assignee: Sun Microsystems, Inc., Mountain View, Calif.

[21] Appl. No.: 412,157

[22] Filed: Mar. 28, 1995

[51] Int. Cl.$^6$ .............................. G06F 11/34; G06F 11/00
[52] U.S. Cl. ......................................... 395/183.08; 371/27
[58] Field of Search ......................... 395/183.01, 183.06, 395/183.08, 183.09, 189.081; 371/27, 20.4; 364/265.6

[56] References Cited

U.S. PATENT DOCUMENTS

| | | | |
|---|---|---|---|
| 4,493,078 | 1/1985 | Daniels | 371/25.1 |
| 4,500,993 | 2/1985 | Jacobson | 324/73 R |
| 4,789,821 | 12/1988 | Baschiera et al. | 324/158 R |
| 4,931,722 | 6/1990 | Stoica | 371/22.5 |
| 5,202,889 | 4/1993 | Aharon et al. | 371/25.1 |
| 5,455,938 | 10/1995 | Ahmed | 395/183.13 |

*Primary Examiner*—Robert W. Beausoliel, Jr.
*Assistant Examiner*—Albert Decady
*Attorney, Agent, or Firm*—Hickman Beyer & Weaver

[57] ABSTRACT

A pseudo-random test system which generates the text for a sequence of assembly language instructions by intermixing text instructions generated by pre-programmed operations from at least two test generators is provided. The test generators are executed to program operations into a test interpreter which mixes the operations and outputs text for a pseudo-random sequence of assembly language instructions for execution on a processor. In addition to mixing text instructions generated by pre-programmed operations, the system randomly allocates internal registers and provides self-checking constructs used to compare the processor's results with expected results.

27 Claims, 9 Drawing Sheets

5,572,666

SYSTEM AND METHOD FOR GENERATING PSEUDO-RANDOM INSTRUCTIONS FOR DESIGN VERIFICATION

BACKGROUND OF THE INVENTION

The present invention relates to systems and methods for design verification of devices. More particularly, the present invention relates to pseudo-random testing of processors that may be used in computers or other processing machines.

During the development and manufacture of microprocessors, there is a need to exhaustively test various designs and products before release to customers. Ideally, a processor's performance is verified for all possible circumstances under which it might be operated in the real world. Unfortunately, this would involve testing a potentially infinite number of machine operation sequences and therefore require a prohibitively long time to generate and run test sequences.

To sample a wide range of possible machine operation sequences for design verification, random instruction generators were developed. These systems simply generate a random sampling of instructions (typically in the processor's assembly language) which is then converted to machine code and tested on the processor. Although such systems can provide a wide range of possible processor operations with minimal user input, they have no understanding of what operation sequences are likely to be encountered in the real world. Further, they do not understand which operation sequences might be most difficult for the microprocessor to handle. Thus, they sometimes fail to adequately test important aspects of a processor's functioning.

In an alternative approach, a human programs a sequence of test instructions for verifying the processor design. In so doing, the user makes use of his knowledge of real world situations in which the processor might be expected to encounter difficulty. This allows the programmer to design tests which he or she expects to be difficult for the processor to successfully handle. Unfortunately, each user's experience is somewhat limited. Therefore, the test code likely will not sample a sufficiently large number of situations to adequately test the processor. Further, if the programmer was to attempt to write tests encompassing a sufficiently wide range of test cases, he or she would eventually spend a prohibitively long time developing the test code.

Thus, there exists a need for a testing system that can provide both a wide range of processor operation sequences together with specific test sequences which might be expected to provide real world difficulties for a target processor.

SUMMARY OF THE INVENTION

The present invention provides a pseudo-random test system which generates a processor instruction text file (containing a sequence of instructions in a target processor's assembly language) by intermixing assembly language instructions provided from at least two sources. Typically, these sources are programs (called "test generators" herein) which when executed program various operations into a "test interpreter." The test interpreter, in turn, interprets these operations in a manner that pseudo-randomly mixes assembly language instructions specified by the various test generators to output a "processor instruction text" file containing a sequence of assembly language instructions for running on the target processor. The test generators may be programmed to contain blocks of operations which must be interpreted back-to-back (without mixing between multiple test generators) such that the processor instruction text file includes instruction sequences specifically tailored to a user's requirements. Test generator operations which have not been programmed to be interpreted back-to-back may be pseudo-randomly shuffled (by the test interpreter) to ensure a full sampling of the range of possible processor instruction sequences. Thus, the systems and methods of this invention provide the benefits of random instruction generators and user programmed tests.

The following discussion presents some specific aspects of the invention. It should be understood that the systems and methods of this invention are generally provided as one or more "programs" which "run" on digital computers. The "programs" which implement this invention are distinct from the "processor instruction text" which is generated (output) by running the programs of this invention. Further, it should be understood that the processor of the digital computer on which this invention is implemented is distinct from the processor on which the "processor instruction text" file is intended to be tested (e.g., a processor whose design is being verified). The processor on which the instruction text file is to be executed will be retorted to herein as a "target processor." Further, it should be understood that as used herein, the term "processor instructions" refers to low level instructions such as assembly language instructions or machine code for execution on the target processor.

In one aspect, the system of this invention includes (a) at least one executable test generator which when executed programs operations specifying particular processor instructions to be used in a sequence of processor instructions for execution on a target processor; and (b) a test interpreter which at least partially shuffles the particular processor instructions from the at least one test generator and generates the sequence of processor instructions for execution on said target processor. This shuffling mixes the instructions from test generators in a defined yet somewhat random manner. The output sequence of instructions may be characterized as including at least two of the particular processor instructions which originally occurred back-to-back (from the test generator) being separated from one another by at least one other processor instruction. In a preferred embodiment, the system includes a mechanism for simulating the expected results of the target processor running at least a portion of the sequence of processor instructions.

Usually, the test generators are programs which specify two types of operations for the test interpreter. As mentioned, one type specifies generation of particular processor instruction text (e.g., assembly language instructions such as store, load, floating point addition, branch, etc.). The other type specifies "interpreter control operations" which can control how the test interpreter generates the sequence of instructions. Examples of such test interpreter control operations include (1) operations for running the target processor in a privileged mode (or supervisor mode) which allows execution of machine instructions that are not generally available, (2) operations for causing a defined sequence of particular processor instructions to be included back-to-back in the output sequence of instructions, (3) operations for randomly allocating physical registers in the output sequence of processor instructions, and (4) operations for simulating expected results and expected cache activity.

In another aspect, the present invention provides a related method for generating a sequence of processor instructions for execution on a target processor. The method includes the following steps: (a) providing a plurality of executable test generators, each of which includes code containing interface calls, (b) executing one of the test generators such that the interface calls are used to program information into a test generator, at least a portion of said information specifying particular processor instructions to be used in the sequence of processor instructions for execution on the target processor, (c) shuffling the particular processor instructions to at least partially define the sequence of processor instructions for execution on the target processor, and (d) outputting the sequence of instructions (typically in the assembly language of the target processor). These and other features of the present invention will be presented in more detail in the following specification of the invention and the figures.

DESCRIPTION OF THE PREFERRED EMBODIMENTS

1. Physical Embodiment

The invention employs various process steps involving data stored in computer systems. These steps require physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, values, elements, variables, characters, instructions, operations structures, or the like. It should remembered, however, that all of these and similar terms are to be associated with the appropriate physical quantities and are merely convenient labels applied to these quantities.

Further, the manipulations performed are often referred to in terms, such as executing, running, or interpreting. In any of the operations described herein that form part of the present invention, these operations are machine operations. Useful machines for performing the operations of the present invention include general purpose digital computers or other similar devices. In all cases, there should be borne in mind the distinction between the method of operations in operating a computer and the method of computation itself. The present invention relates to method steps for operating a computer in processing electrical or other physical signals to generate other desired physical signals.

The present invention also relates to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given below.

Figure 1:
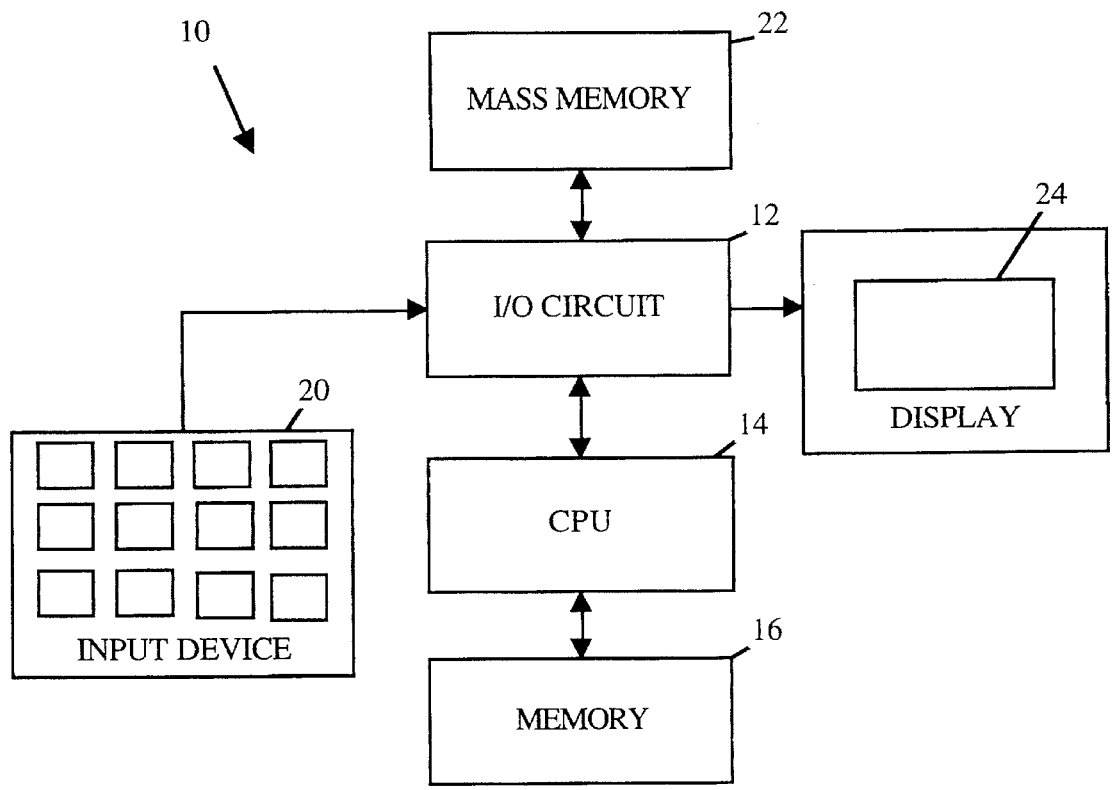
FIG. 1 shows a block diagram of an apparatus that can be use in generating the instruction sequence text files of this invention.

FIG. 1 shows a typical computer-based system according to the present invention. Shown is a computer 10 which comprises an input/output circuit 12 used to communicate information in appropriately structured form to and from the parts of computer 10 and associated equipment, a central processing unit 14, and a memory 16. These components are those typically found in most general and special purpose computers 10 and are intended to be representative of this broad category of data processing machines.

FIG. 1 also illustrates an input device 20 shown as a keyboard. It should be understood, however, that the input device 20 may actually be a transducer card reader, a magnetic or paper tape reader, a tablet and stylus, a voice or handwriting recognizer, or some other well-known input device such as, of course, another computer. A mass memory device 22 is coupled to the input/output circuit 12 and provides additional storage capability for the computer 10. The mass memory device 22 may be used to store programs, data and the like and may take the form of a magnetic or paper tape reader or some other well known device. It will be appreciated that the information retained within the mass memory device 22, may, in appropriate cases, be incorporated in standard fashion into computer 10 as part of the memory 16.

In additional, a display monitor 24 is illustrated which is used to display the images being generated by the present invention. Such a display monitor 24 may take the form of any of several well-known varieties of cathode ray tube displays, LCDs, or some other well known type of display.

As is well known, the memory 16 may store programs which represent a variety of sequences of instructions for execution by the central processing unit 14. For example, the test generator programs for providing the processor test instruction sequence may be stored within the memory 16.

2. Operation and Architecture of the System

Figure 2:
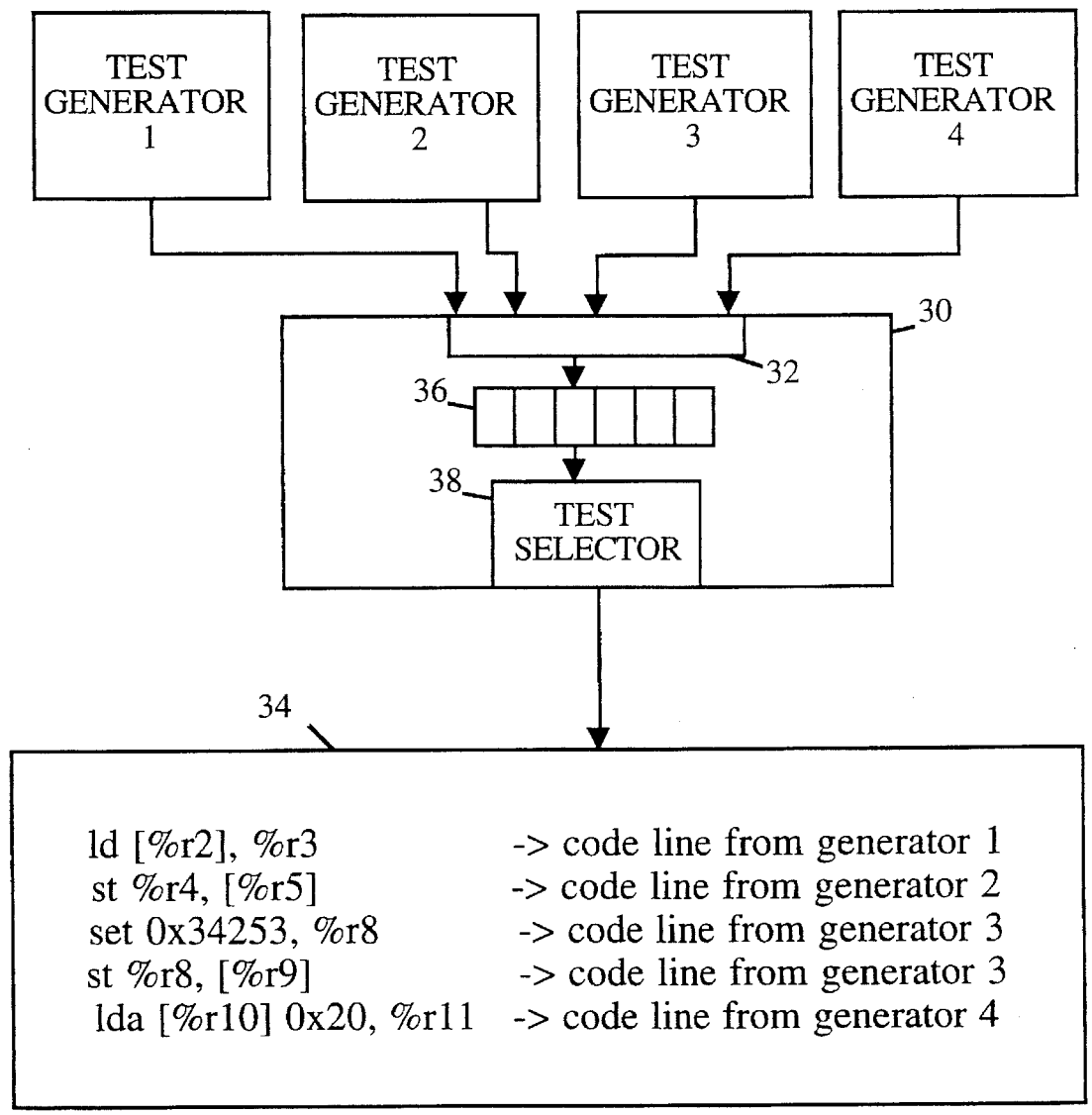
FIG. 2 provides a block diagram of the general architecture of a system of this invention.

An overview of a system of the present invention will now be described with reference to FIG. 2. As shown, the system includes a plurality of test generators (in this case Test Generators 1–4) coupled to a test interpreter 30. Instructions from the test generators are used in conjunction with operation of the test interpreter to output a text file 34 containing the pseudo-random sequence of instructions for the target processor. If text file 34 contains assembly language instructions, it can be assembled and subsequently executed on the target processor.

As used herein, the "target processor" may be any device that processes signals in a computational environment. For example, a microprocessor, a chip set, a mother board, and even a complete computer system with a CPU, memory, etc. constitutes a "target processor" within the meaning of this invention. Further, a target processor may be a software representation of a processor such as a representation written in a hardware design language (e.g., Verilog). Although microprocessors from numerous vendors can be tested according to the methods of this invention, particularly appropriate microprocessors are the SPARC microprocessors available from Sun Microsystems of Mountain View, Cali. Such processors conform to the SPARC architectural standard as set forth most recently in "The SPARC Architecture Manual," Version 9, Weaver and Germond, Eds., PTR Prentice Hall, Englewood Cliffs, N. J. (1994), which is incorporated herein by reference for all purposes.

Each test generator is a program which when executed in this system will program operations and associated parameters into test interpreter 30. Specifically, the test generators contain within their code "interface calls" which when executed program operations and data used by the test interpreter to generate the content to text file 34. The operations which can be programmed generally fall into two distinct categories: 1) those which tell the test interpreter to generate processor instruction text, and 2) those which can control the actions of the test interpreter (sometimes referred to herein as "interpreter control operations"). Generating the output text file 34 entails a three general process steps. First, a test slot 36 is selected which will be used to hold the operations which are programmed. Second, a test generator program is selected and executed thereby programming, or copying, the operations and associated parameters from the interface calls into space within the selected test slot, called operations structures, provided by the test interpreter. Third, the operations programmed into slots 36 are interpreted—in a pseudo, random order—to ultimately generate the sequence of processor instructions text into file 34.

The test generators may be written in a variety of languages, including custom test languages specifically designed for simulation environments. Generally, however, conventional languages such as "C" are preferred because they are understood by a large class of users. Further, these languages contain many constructs that might not be available in a custom language, thus allowing the test generators to generate a wide range potential instructions.

When a test generator is selected and executed, an interface 32 receives the interface calls from the test generators and copies the information provided in the interface calls into operation structures provided by the test interpreter within one of the test slots 36, thereby programming the operations. After the operations are programmed into a slot, they are interpreted one at a time to produce text in output file 34. Specifically, while any given slot is chosen, its operations structures are interpreted sequentially until the last instruction is encountered or until a different slot is chosen. Typically, the operations structures in a test slot will not be interpreted from start to finish without interruption. This is because a test selector 38 within test interpreter 30 periodically switches among the individual slots 36. The circumstances under which the test selector 38 switches slots will be discussed below. As shown in FIG. 2, the switching causes file 34 to include code text front operations programed by Test Generator 1, Test Generator 2, Test Generator 3, Test Generator 3, and Test Generator 4.

An exemplary process for generating a processor instruction text file (corresponding to file 34 of FIG. 2) will now be described with reference to FIG. 3. Initially there may be a large number of test generators available to a test interpreter 50. However, at the outset of a run, a group of the available test generators to be used in the run is designated. Only programmed operations in those "designated" test generators will be used to prepare the output text file containing the processor instruction text. Initially, the test interpreter randomly selects one of these designated test generators. That first test generator is then executed from top to bottom and the interface calls contained within it program the "operation structures" mentioned above. Each such operation structure will hold the opcode and associated parameters provided in the interface call. When the first test generator is executed, its associated operation structures contained in the selected test slot (from the group of slots 54) within the test interpreter, are sequentially filled with the data contained as parameters in the interface calls (one interface call copies its information into one operation structure), thereby programming the operation structures.

After the first selected test generator is finished executing, and therefore the first slot's operations structures have been programed, the test interpreter 50 begins the process of filling a file 60 with the processor instruction text (which will ultimately become the output sequence of instruction text). It does this by sequentially interpreting the stream of operations structures 56 in the first slot. Eventually, the test interpreter shifts to a different test slot. It may be forced to do this by an operations structure explicitly requiring that it switch, or, alternatively, it may itself determine that it is time to switch.

Figure 3:
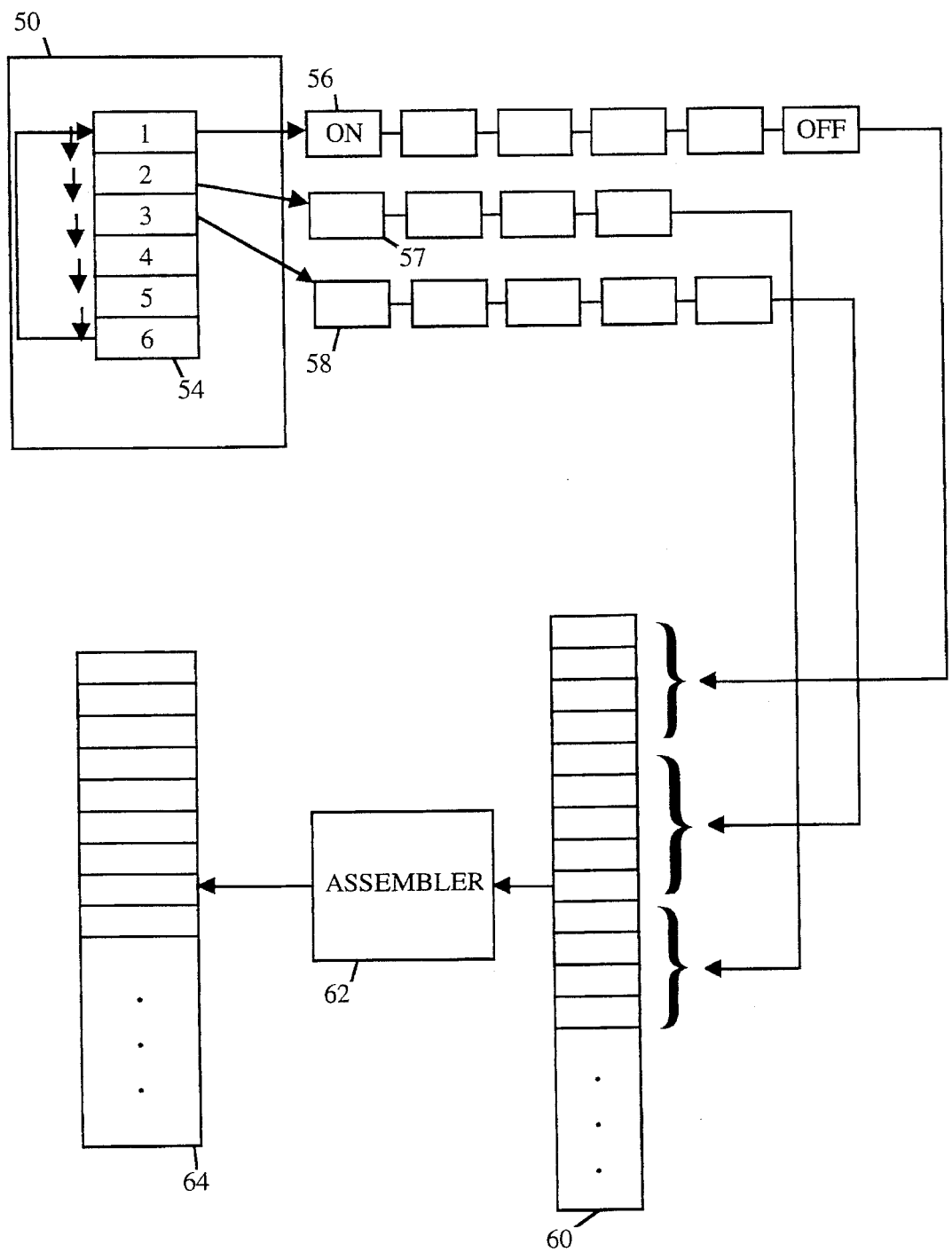
FIG. 3 depicts a process by which operations structures programmed in a test interpreter are used to generate an output file containing a sequence of processor instructions text.

In the example depicted in FIG. 3, an "ATOMIC ON" operation at the beginning of the stream specifies that subsequent operations are to be kept together without separation (i.e., they are to be interpreted back-to-back). This is an example of an interpreter control operation provided by the test generators. When this command is interpreted by interpreter 50, it indicates that no further switching is to be performed until an "ATOMIC OFF" operation is received. In the example of FIG. 3, four operations structures containing opcodes which tell the instuction interpreter to generate processor instructions follow the ATOMIC ON operations structure. The test interpreter inserts the text specified by these operations structures (e.g., assembly language instructions for the target processor) one-by-one into the file 60. Thereafter, an ATOMIC OFF command is encountered in stream 56. It should be understood that additional operations structures (not shown) would follow the ATOMIC OFF command, and a DONE operation structure would appear at the end of the sequence.

Normally, after each operations structure is interpreted, the test interpreter randomly determines whether to switch to another test slot from the group 54. However, the ATOMIC ON command overrides this function and forces the test interpreter to interpret the subsequent operations structures in the slot (at least until an ATOMIC OFF instruction) without switching. In the example of FIG. 3, the test interpreter is forced to interpret the five operations structures following the ATOMIC ON command in stream 56. However, after the fifth instruction, the ATOMIC OFF command, the interpreter decides, in this example, to switch test slots immediately.

Typically, there are multiple test slots in the test interpreter. In this example, there are six test slots in the group 54. The test interpreter cycles through these slots in a round robin order, each time it is required to make a switch. Thus, in this example, the interpreter will access the slots in the following order: 1, 2, 3, 4, 5, 6, 1, 2, 3, 4, 5, 6, etc. This order is denoted by the arrows to left of test slots 54.

According to the sequence of events depicted in FIG. 3, when the test interpreter is switches from the first test slot to the second test slot (in this case after the ATOMIC OFF instruction is encountered), it will discover that the second test slot is empty. It then randomly selects one of the available test generators. This may or may not be the test generator that was selected for the first slot. If there is a large number of designated test generators, the chances are good that a different test generator will be selected. However, if there are only two or three available test generators, the selected test generator may well be the one previously selected. And if there is only a single available test generator, the selected test generator will have to be the one previously selected.

The designated test generator which is selected is executed from top to bottom to generate operations structures which program the second test slot. Then a second stream of operations structures 57 from the second slot are interpreted in sequential order all the while adding processor instructions to the file of processor instructions text 60 which already contains text for four instructions provided during interpretation of the operations structures in the first slot. As in the case of the first test slot, the interpreter will eventually switch to the next test slot in round robin order. In this case, the test interpreter randomly requires that the test slot be switched after four operations structures from the second slot are interpreted. Then, the third test slot is filled with operations structures programmed from a randomly selected test generator as described above. A third stream of instruction structures 58 is then interpreted as were those in the first and second test slots. When a switch is dictated by the test interpreter, the interpreter will proceed to the fourth test slot and so on in a similar manner. Eventually, the last test slot (slot 6 in this case) is filled. When the next slot switch is required, the system will return to a previously filled test slot. The interpreter will then interpret the operations structure immediately following the one it left off with when it last switched out of that test slot. It will continue interpreting operations structures in that slot sequentially until it is again required to switch test slots. At that point, the system follows the round robin order to the next slot where it again picks up where it left off before the last switch. It should be apparent from this discussion that the sequences of operations structures 56, 57, and 58 would continue beyond the rightmost structures shown in FIG. 3.

The interpreter continues adding processor instruction text to its instruction file 60 by moving from slot-to-slot in this round robin manner. Ultimately, the interpreter will encounter the last instruction in a test slot. At that point, it clears the slot and moves to the next slot. When it again returns to the now empty slot, it refills it with operations structures by executing another randomly selected test generator. Slots are emptied and refilled in this manner until a specified number of test generators have been executed. At that point, the remaining instructions in the slots are added to the text file as described above. One by one the slots will become empty. Ultimately, only one slot contains operations structures. When the interpreter then attempts to switch to a different slot, it is forced to return to the sole remaining slot with operations structures. Finally, the last operations structure of the last slot is processed, and the process is completed. At this point, the file of processor instructions 60 is complete. Subsequent assembly by assembler 62 produces machine readable output 64 which is available for testing on the processor.

As is apparent from the above discussion, the file of processor instructions text will contain somewhat randomly mixed instructions from the various test generators. As will be explained in more detail below, the circumstances under which the interpreter decides to switch from one test slot to another adds flexibility and some control over arrangement of processor instructions in the final sequence of test instructions.

In preferred embodiments of this invention, the test generators and test interpreter provide various control functions in addition to the instruction shuffling function described in the above example. Some of these additional functions will now be described.

When an "operation" has been programed via a test generator (through an interface call), which causes the test interpreter to generate processor instruction text, and that generated processor instruction text requires a processor register, a so-called "virtual register" (0–31 in the case of integer or double precision floating point registers in the SPARC V9 standard) is specified in the interface call. The test interpreter then translates that specified "virtual register" to an appropriate processor physical register. This translation is based on architecture specific rules and information provided by the test generator.

To make sure that physical registers are not duplicated, the interpreter keeps track of the registers that are not being used, and chooses among them somewhat randomly. In addition to ensuring that the physical registers are not duplicated, the interpreter attempts to use many different physical registers. It does so by maintaining a running tally of the recently used physical register addresses, and, when possible, chooses physical registers so that many different physical registers are ultimately chosen.

In preferred embodiments, there is a mechanism to simulate memory activity. Such systems provide not only the ability to generate pseudo-random processor instruction text, but also partially provide an architecture specific simulator to predict memory data and cache activity. Using interface calls which program the EXEC operation (described below), subroutines provided by the test interpreter to store data provided by the test generator into the testing system memory or retrieve data from the testing system memory can be called, thereby simulating the results of processor load and store instructions while they are being generated. This testing system memory is referred to herein as a "shadow memory model". Additionally, the testing system provides a built in architecture specific cache model, which is internally connected to the shadow memory model. When the EXEC operation is interpreted which calls the shadow memory model store or load routines, the cache models are also executed to simulate architecture specific cache activity caused by the load or store operation. Other processor models may be used for simulating the results of the generated sequence of text instructions.

As noted, the test generators can provide ATOMIC ON and ATOMIC OFF operations to control the processor instruction arrangement in the final test instruction sequence. In addition, the test generators can specify such control instructions as branching, waiting, test switching, etc. Branching allows the test generator to specify a particular location in the final instruction sequence where a designated block of instructions should appear. Waiting puts on hold the interpretation of the operations structures in a current slot until a specified number of instructions from other tests have been interpreted. Test switching performs the opposite function of ATOMIC ON. Specifically, it forces the interpreter to move to the next test slot.

There is a subset of instructions which can only be executed by the processor under test in privilege mode. These are called "privileged instructions". These are privilege instructions. These instructions generally include those which can severely affect the target processor's internal state. Any attempt to execute one of those instructions in non-privilege mode causes a privilege mode trap.

In order for the testing system of this invention to generate processor instruction text which will properly run on the target processor in both modes interchangeably, it contains a feature which allows a test generator to program an operation which will generate the architecture specific instruction text to switch the processor to privilege mode before a privileged instruction is generated (if the current mode is non-privilege) and to switch back to the previous mode after generating the privilege mode instruction text. In this way the test generator has a programmable way of switching the processor mode. Note that this sequence is done atomically (without test switching):

program ATOMIC_ON operation program SWITCH2SUP operation program privilege instruction operation program SWITCH2USER operation program ATOMIC_OFF operation Using this type of programming sequence, when the SWITCH2SUP operation is interpreted, the test interpreter will examine its simulation of the processor state and determine if the instruction test to switch to privilege mode is needed to be generated. If the testing system internal simulator indicates that the processor state is already in privilege mode, then no special processor instruction text need be generated. If the current mode is non-privilege then it will generate architecture specific instruction text which will cause the processor under test to which to the appropriate mode. Similar actions will occur for the SWITCH2USER operation.

Yet another feature of preferred test generators is the ability to specify types of addresses such as (1) addresses in main memory, (2) addresses in the cache, (3) addresses that have been previously used, and (4) addresses that have been previously unused. From a list of desired types (e.g., the addresses meeting the criteria of 2 and 3), the test interpreter will randomly select an address when generating a test instruction sequence.

Another available function in preferred embodiments of this invention is the ability to randomly switch between "contexts" during execution of the test instructions. A "context" is defined herein as a part of an address which maps a virtual address in a microprocessor to a physical address in main memory. Typically, the context part of an address is an 8 bit word. A context can also represent an individual process running on a processor in a multitasking environment. In preferred embodiments, the test generator can specify that the test interpreter randomly select a context from a predefined group. Preferably, between 2 and 8 contexts are provided for random selection. By allowing the use of multiple contexts during a test, this invention can simulate multiple processes running on a single processor. This feature is important in testing microprocessors used in multitasking environments such as Unix. In some embodiments, the test generators can specify a particular context independently of the test interpreter.

In still other preferred embodiments, the test generators can specify that the test interpreter randomly pick "register windows." Some microprocessors such as a SPARC microprocessor used by Sun Microsystems have frames or register windows that overlie a register file. By incrementing and decrementing the frame in a register file, different register windows are specified. By providing the ability to randomly select (with test generator instructions) different register windows, the system ensures that a sufficient range of register windows in the architecture are tested. Preferably, between 2 and 8 different windows are provided for random selection.

As mentioned above, the system of this invention can simulate expected results. Thus, in further preferred embodiments, the test generators of this invention can provide self-checking constructs to generate the expected results of certain instructions that they require. This may be accomplished in various ways such as using "compare" statements in the test generator code. Such statements allow the system to generate an expected result for a sequence of instructions and then compare it with the actual result computed by the processor. If the real and expected results do not agree, there may be a problem. For example, the instructions might (1) set a value of five into register one, (2) store register one to main memory, physical address zero, (3) load from address zero and put the value into register two. The system would expect from this sequence of instructions that the value in register two is five. If on comparison with the real result, there is a discrepancy, a processor error has occurred. In addition, to "compare" commands, other self-checking systems such as appropriate simulation models known to those of skill in the art may be employed.

As should be apparent by now, the test generators can specify numerous control instructions for dictating how the final processor instruction sequence appears. By way of illustration and not limitation, control instructions include specifying comments, execution of C routines via EXEC, test control via ATOMICON, RANDOM_ATOMICON, ATOMICOFF, TESTSWITCH, WAIT, and DEFERTEST, register deallocation via RELEASE and RELEASEFP, and placing a branch label in instruction text via PUTLABEL. A further description of those functions listed in capital letters is provided below. The virtual to physical mapping information, which is architecture specific, may be user definable, via a test setup file, for example.

Figure 4:
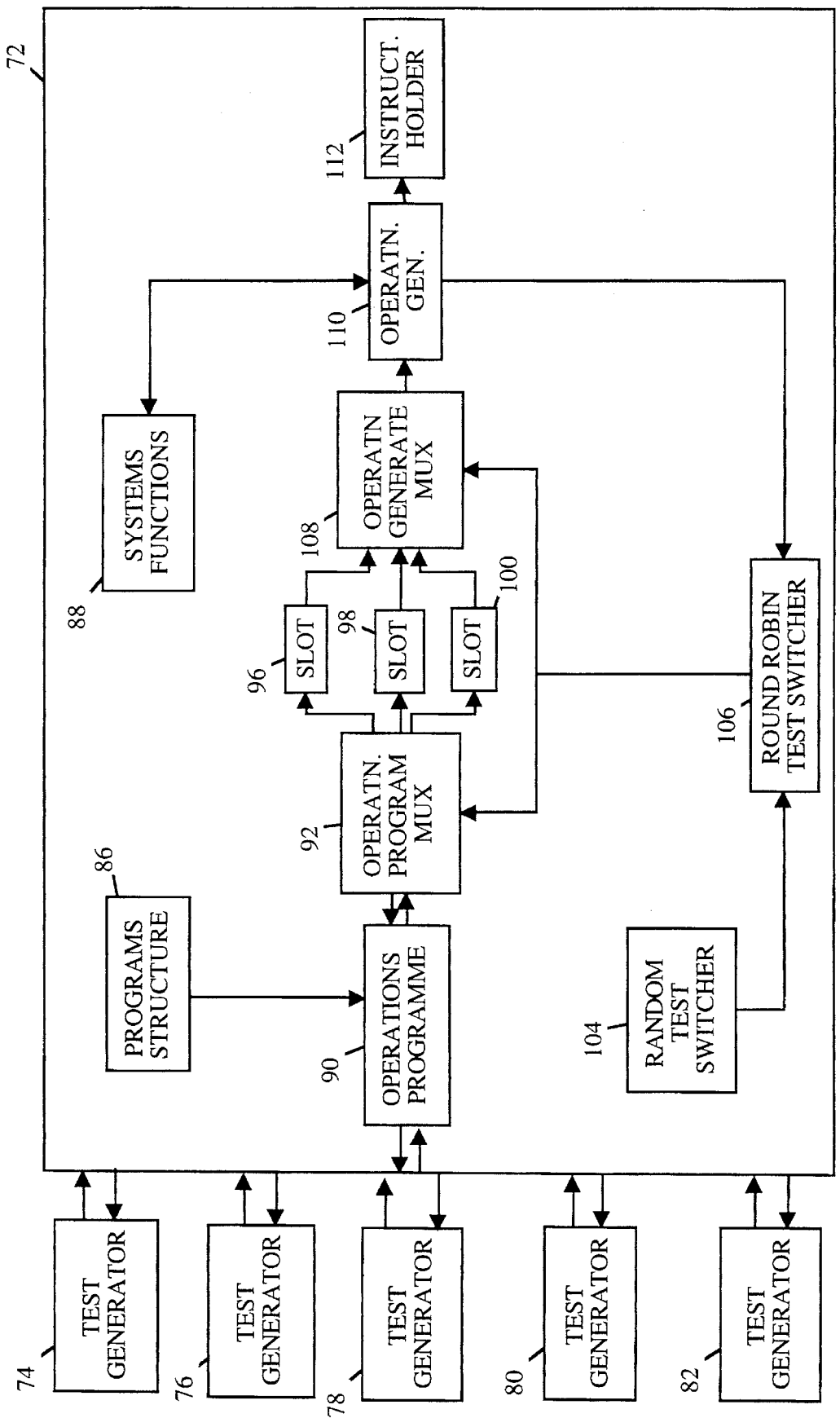
FIG. 4 provides a block diagram depicting details of a test interpreter according to a preferred embodiment of this invention.

FIG. 4 presents a detailed diagram of the system architecture in accordance with a preferred embodiment. As described above, the system includes test generators (shown as test generators 74, 76, 78, 80, and 82 in FIG. 4) and a test interpreter 72 including test slots (shown as test slots 96, 98, and 100 in FIG. 4) and a round robin test switcher 106. Each of the test generators 74, 76,78, 80, and 82 communicates with the test interpreter through an operation programmer 90.

The operation programmer 90 gets a designated test generator whenever an empty test slot needs to be filled. The operation programmer 90 then executes the test generator program to program or fill the operations structures from the interface calls.

The random test switcher 104 provides the test interpreter's internal mechanism for randomly deciding when to switch test slots. Each time an operations structure is interpreted, test switcher 104 randomly decides whether to switch to a different slot. If test switcher 104 determines that a switch should be performed, it notifies a round robin test switcher 106. Thereafter, the round robin test switcher 106 forces a move to the next test slot. Preferably, the system includes a command line option for specifying how often, on average, the random test switcher should force a slot switch. It is been found that for some systems, a default switch rate of on average about once every two operations structures is appropriate.

The test generators can override the random test switcher 104 by specifying an "ATOMIC ON" mode. Operations structures between ATOMIC ON and ATOMIC OFF commands must be interpreted back-to-back. Thus, the random test switcher is instructed not to switch tests slots while operations structures in ATOMIC mode are being interpreted.

An operation generator 110 is responsible for interpreting each operation opcode within the operation structures for each slot. If the opcode instructs the operation interpreter to generate processor instruction text, then the appropriate actions will be taken based on the opcode to generate that text (i.e., allocation of processor specific physical register numbers) and the proper text will be added to the processor text output instruction holder 112. If the operation opcode indicates an interpreter control operation, then the test interpreter will internally take the specified action (i.e., pause for a random or specified number of operations, switch to another test, etc.).

Another type of interpreter instruction handled by the instruction generator 110 requires executing a subroutine within the interpreter. These include system provided functions to switch between privilege and non-privilege modes, switching contexts, and generally system provided sets of instructions macros. Such/functions are stored in region 88. Still another interpreter instruction handled by the instruction generator 110 is release of a register. As previously stated, when a programmed operations structure is interpreted, the operation interpreter can perform several different types of actions based on the opcode in the operation structure. One type of these actions is to generate processor instruction text (i.e., generate a processor instruction which will ultimately go into the output file). Depending on the generated processor instruction, a target processor register simulator may be called which will take a "virtual register", provided as a parameter in the operation structure, and allocate an architecture specific physical register number, which is used in the outputted processor instruction text. When this is done, this physical register is allocated until another operation deallocates that register number. This operation is a test interpreter operation called RELEASE (or RELEASEFP for floating point registers).

The operation programmer multiplexer 92 directs which slot the operation programming within the operation interpreter will be programmer next. That is, the next slot (as designated by round robin switcher 106) in which operation structures will be allocated and filled when the test generator is executed. An operation generate multiplexer 108 directs structures from the slot that is currently having its operations structures interpreted to the operation generator 110.

A program structure element 86 is a file providing information about each test generator for use by the interpreter 72. For example, it tells the interpreter which test generators exist and are available for use in the current run. In addition, it tells the interpreter some parametric information about the generator. For example, it contains a default weighting for each generator. This weighting controls the frequency at which each particular test generator is selected (i.e., how often it's operations structures are loaded into the test slots). Although test generators are selected randomly, those with higher weightings are likely to be used more often than those with lower weightings. Additional information in the program structure elements includes virtual address ranges that the test can use, flags to indicate if the test can operate in multiple contexts and register windows and test grouping information for grouping a series of test generators.

Figure 5:
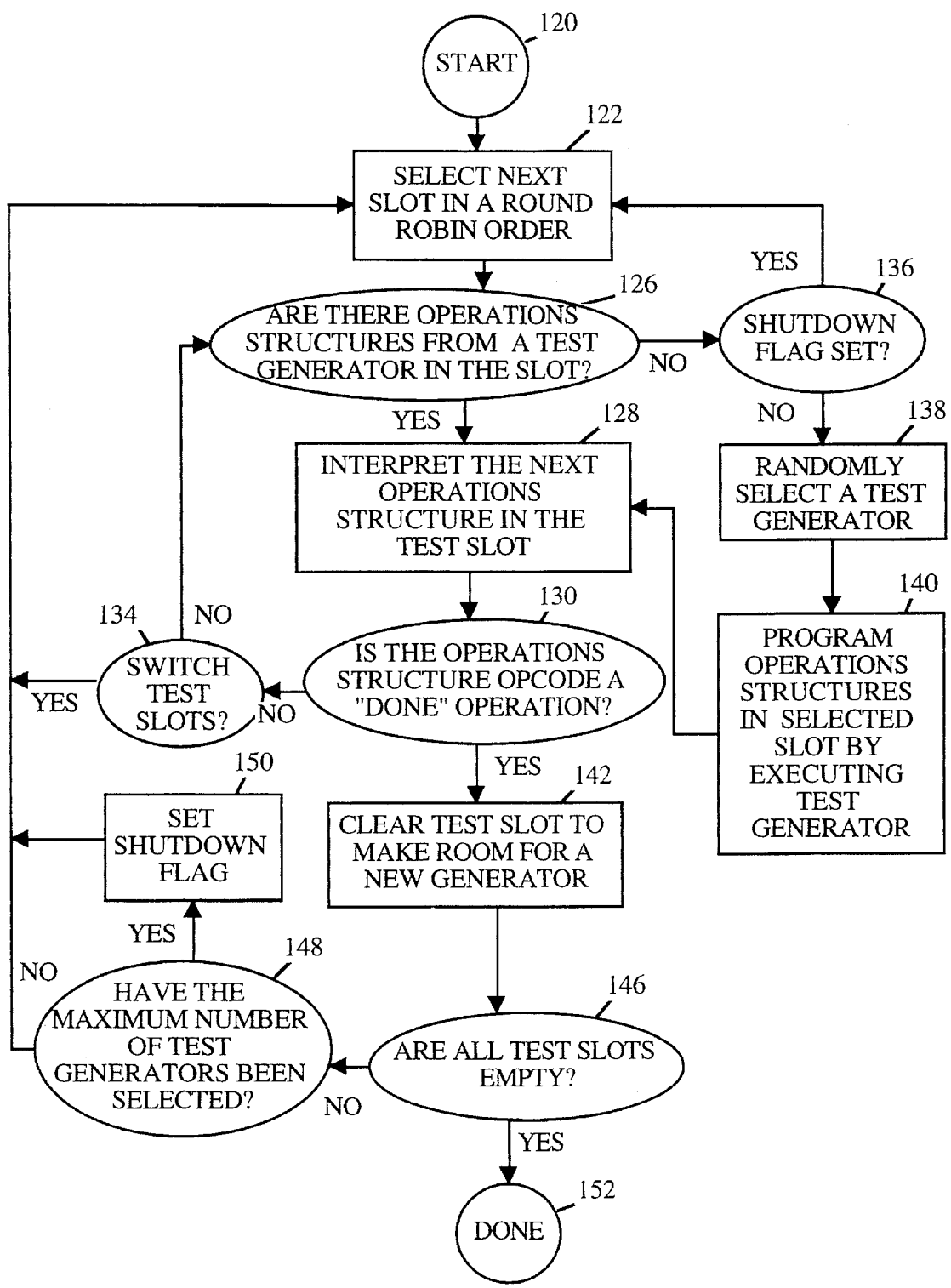
FIG. 5 provides a process flow diagram of the general pseudo-random test generation method employed in a preferred embodiment of this invention.

The process flow of this invention is presented in FIG. 5. The process begins at 120 and in a step 122 the next test slot in the interpreter is selected according to round robin selection order. If the process is just beginning, the first test slot will be selected. After the appropriate test slot has been selected, a decision step 126 determines whether operations structures for any test generator are currently in that slot. If so, a step 128 interprets the next operations structure in the selected test slot. The "next" operations structure will be that operations structure that immediately follows the most recently interpreted operations structure in the test slot. If the test slot has just been filled with operations structures, the "next" operation will be the first operation in that test slot.

After the next operations structure has been interpreted, a decision step 130 determines whether that instruction is a "done" instruction. Such operation indicates that there are no further operations in the test slot (i.e., all programmed operations structures from the test generator have been interpreted). Assuming that the current operation is not a DONE instruction, a decision step 134 determines whether the current test slot should be switched. The conditions under which a switch is called for are detailed in FIG. 7 and the associated discussion below. Assuming that the test slot is not to be switched, process control returns to decision step 126 which again determines whether their is an operations structure from a test generator in the current slot.

So long as decision step 126 is answered in the affirmative and decision steps 130 and 134 are answered in the negative, the system continues to sequentially execute operations structures (step 128) in a single slot. If decision step 134 determines that it is time to switch test slots, process control returns to step 122 where the next slot is selected in round robin order. As noted, the conditions under which a switch is required include (1) an internal decision by the test interpreter, and (2) an appropriate control operation from a test generator.

If decision step 130 determines that the current instruction is a DONE operation, a process step 142 clears the current test slot to make room for new operations structures from a test generator. Thereafter, a decision step 146 determines whether the test interpreter is finished. This involves determining whether each test slot in the interpreter has been cleared. If so, the process is completed at 152. If not, a decision step 148 determines whether the final number of test generators have been selected. This is accomplished by maintaining an account of the test generators that are to be used in the run. When that number has been loaded into test slots, the system recognizes that is to load no further test generators. The interpreter is notified of this condition by setting a shut down flag at step 150. Thereafter, process control returns to step 122 where the next slot is selected in round robin order. If decision step 148 determines that the requisite number of test generators have not yet been selected, process control returns directly to step 122 without first setting a shut down flag at step 150.

If at any time, decision step 126 indicates that there is, in fact, no operations structures in the current slot, a step 136 determines whether the shut down flag has been set. Assuming that a shut down flag has not been set, a process step 138 randomly selects an available test generator. Thereafter, a process step 140 executes the test generator which programs the operations structures from that test generator into the selected slot. When this process is completed, step 128 interprets the next operations structure in the current test slot. Because the operations structures have only at this point been placed in the test slot, the next operation will be the very first operation in that test slot.

Figure 6:
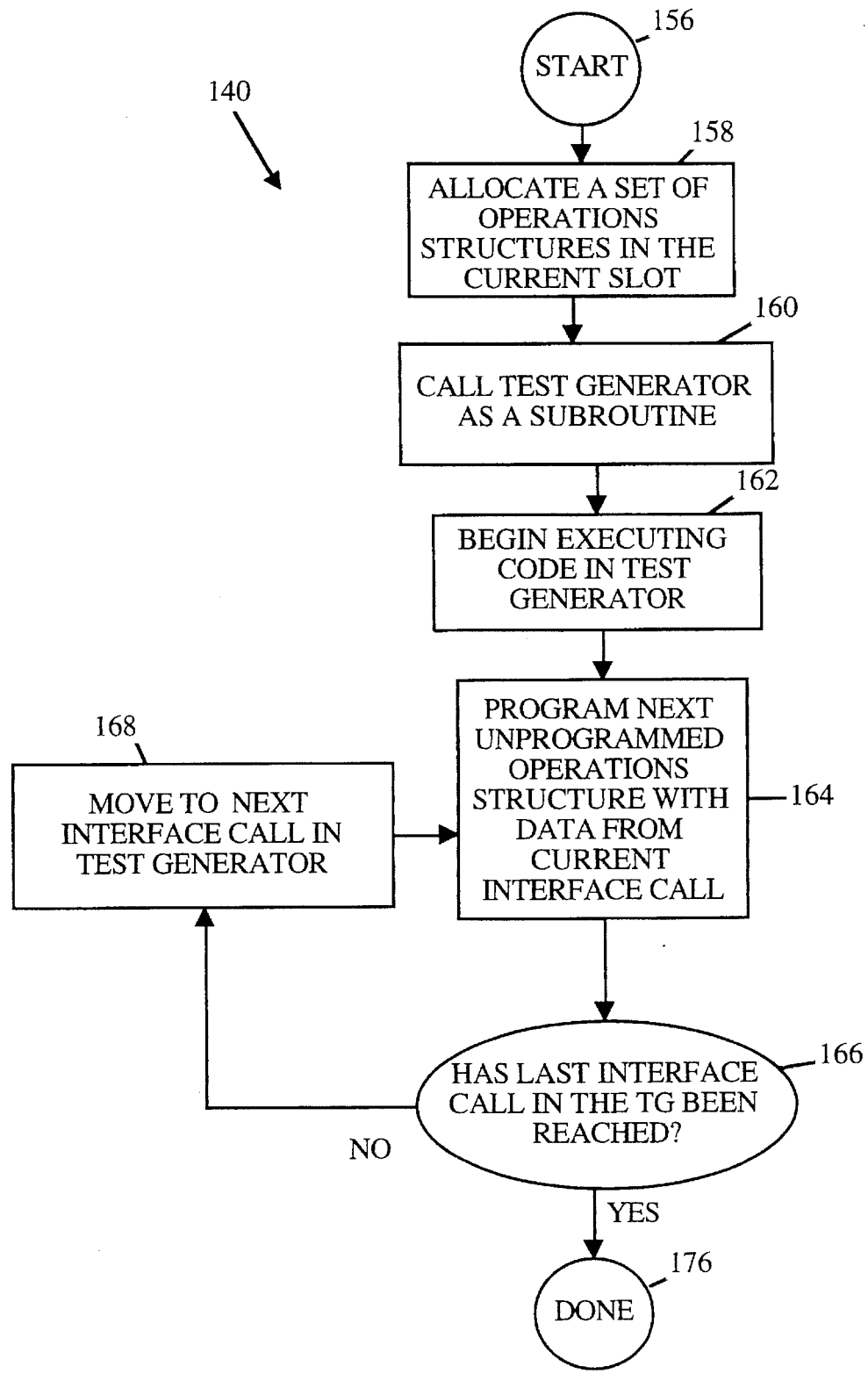
FIG. 6 provides a process flow diagram depicting the method by which empty slots in a test interpreter are filled with operations structures.

FIG. 6 details the steps employed in placing operations structures from one test generator in a selected test slot (i.e., step 140 of FIG. 5). The process begins at 156 and in a step 158 a set of operations structures is allocated in the current slot. Thereafter, the selected test generator is called as a subroutine at step 160, and execution of the code associated with that subroutine begins at step 162. Next, a step 164 programs the next unprogrammed operations structure in the current test slot with data and parameters from the current interface call. When this is process is complete, a decision step 166 determines whether the current interface call is the last interface call in the entire test generator. If so, the process is completed at 176. If not, the next interface call in the test generator is located and designated the "current" interface call. Process control then returns to step 164 where the current interface call is programmed into the next available operations structure in the current slot.

Figure 7:
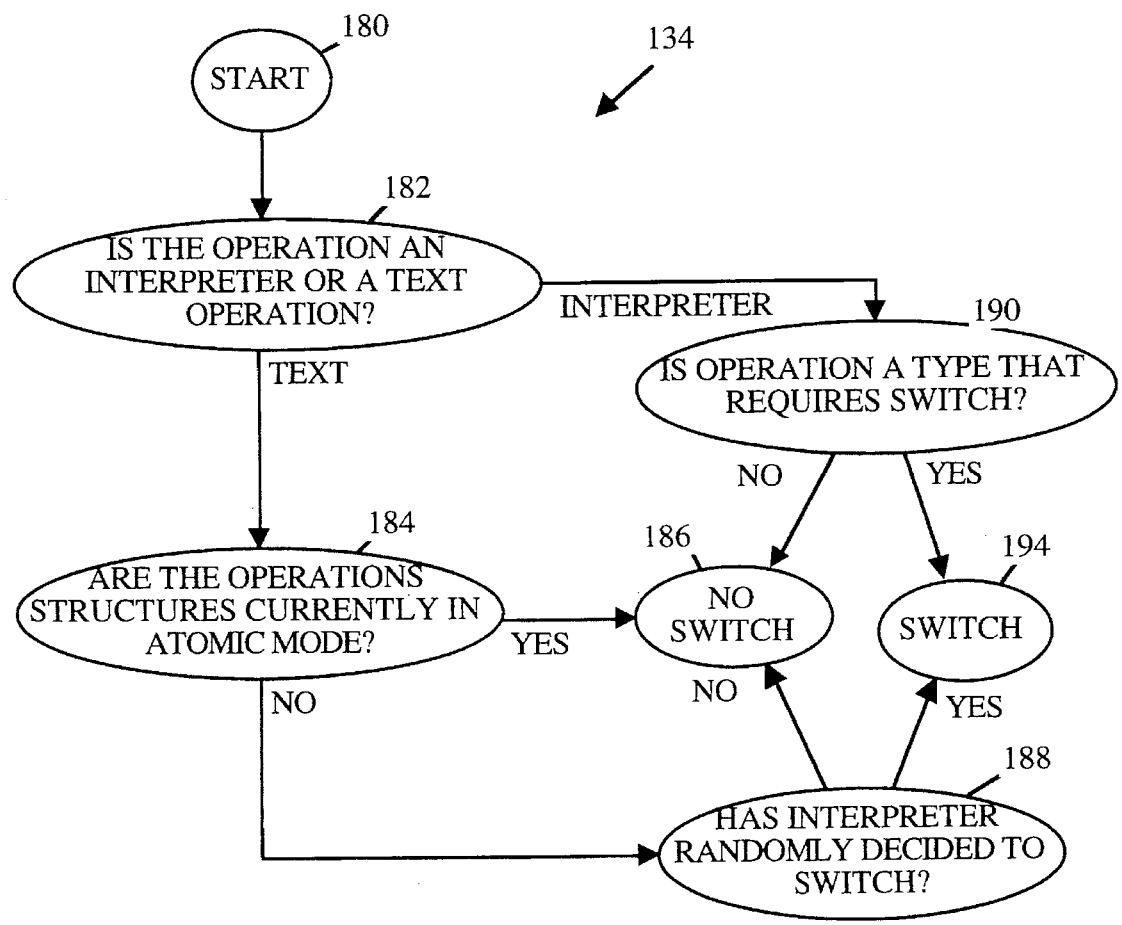
FIG. 7 provides a process flow diagram depicting the method by which a system of this invention determines whether a new test slot should be selected during generation of an instructions text output file.

FIG. 7 details the process by which the test interpreter determines whether the current test slot should be switched (i.e., decision step 134 of FIG. 5). The process begins at 180 and in decision step 182 the interpreter determines whether the current operation is an interpreter control or a generate instruction text operation. If it is a generate instruction text operation, a decision step 184 determines whether the operations structures are currently being interpreted in the atomic mode. As explained, the atomic mode implies that operations are to be interpreted back-to-back rather than being separated by operations from other test slots. If decision step 184 determines that the operations structures are currently within an atomic block, the process is concluded at step 186 which indicates that no switch is to be made (i.e., return to decision step 126 of FIG. 5). If, however, decision step 184 determines that the operations structures are not currently within an atomic block, a decision step 188 determines whether the test interpreter has randomly decided that a switch in the test slots is now required. If such a switch is not required, the process is simply concluded at 186 without a switch. If, however, a switch is required, the process is completed at 194 where a switch in test slots is made (i.e., return step 122 of FIG. 5).

If decision step 182 determines that the current operations structure is an interpreter instruction, a decision step 190 determines whether it is a type of operation that requires a switch. As explained, various test generator instructions can dictate that a switch is in fact necessary. For example, WAIT, DONE and TESTSWITCH interpreter control operations require that a switch be made. If decision step 190 determines that the current operations structure is of such a type, the process is concluded at 194 with a switch. Otherwise, the process is concluded at 186 without a switch.

Figure 8:
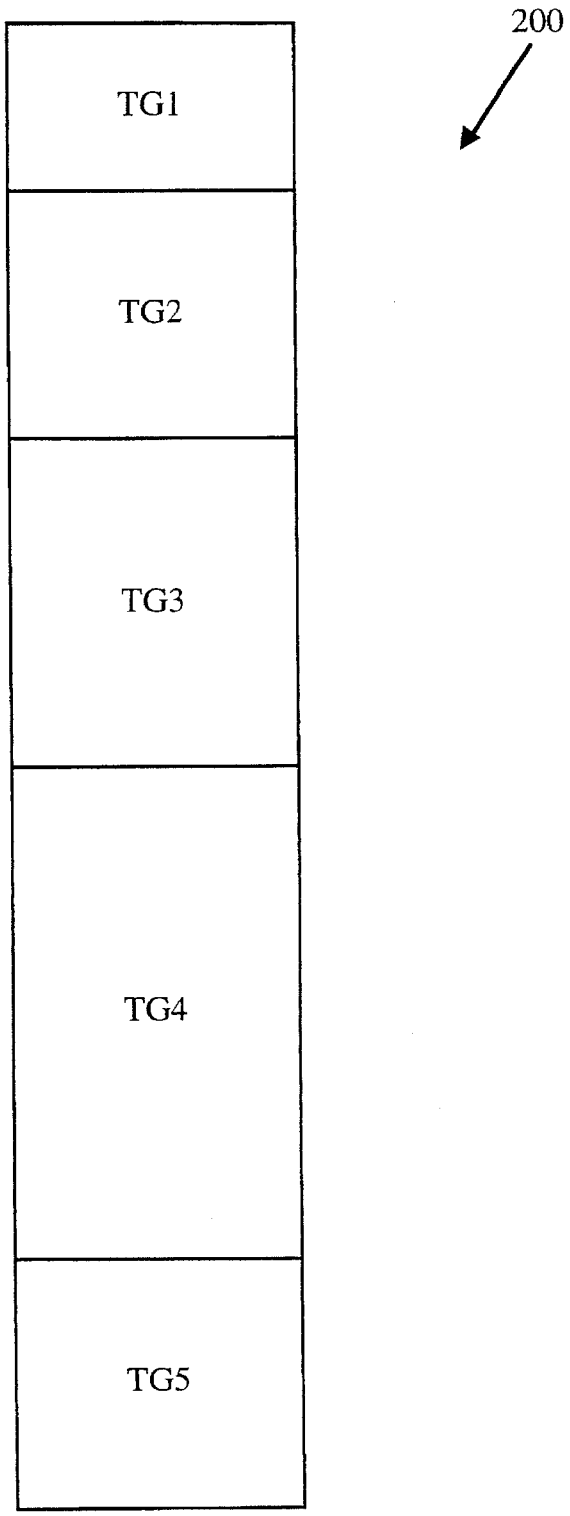
FIG. 8 illustrates a list of test generators with associated weightings for selection in a run in accordance with this invention.

Step 138 of FIG. 5 requires selection of a designated test generator. Although this process may be completely random, it can also have a deterministic component. For example, the individual designated test generators can have "weightings" such that test generators with higher weightings are selected more often then test generators with lower weightings. In a preferred embodiment, the system provides a list of test generators as shown in FIG. 8. The list is used for selection of a test generator each time a slot needs to be filled. The list may contain 100 entries. In the example shown in FIG. 8, there are five different designated test generators (TG 1, TG 2, TG 3, TG 4, and TG 5). If these test generators were to be selected equally often, each would occupy twenty entries of the list 200. The interpreter randomly selecting from the list would hit each test generator once every five tries, on average. As shown, however, the different test generators can be given differing numbers of entries. In this example, TG 1 is given 10% of the entries. TG 2 is given 20% of the entries, TG 3 is given 25% of the entries, TG 4 is given 30% of the entries, and TG 5 is given 15% of the entries. Thus, TG 4 has the highest weighting and is most likely to be selected, while TG I has the lowest weighting and is least likely to be selected.

Figure 9:
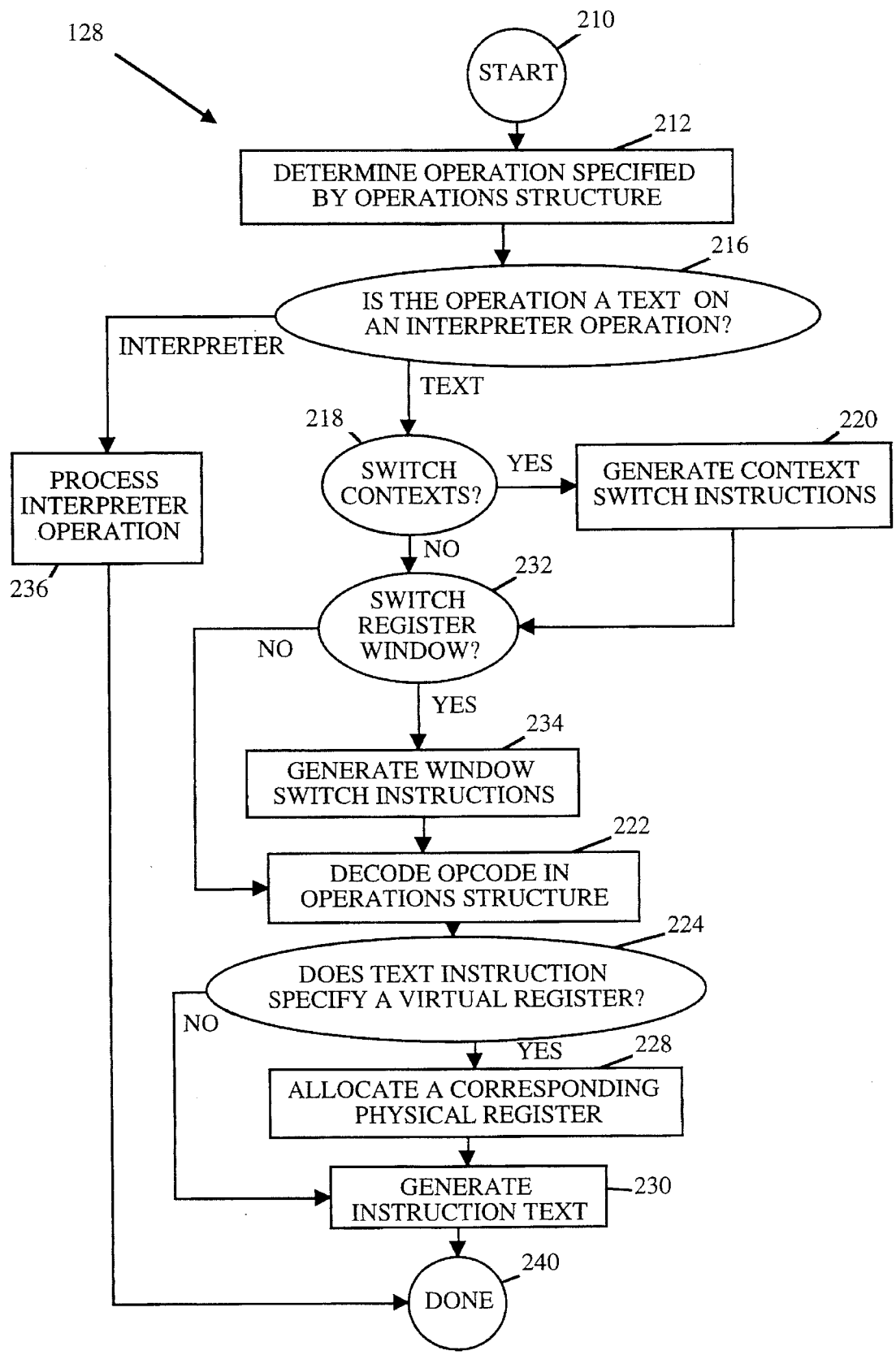
FIG. 9 provides a process flow diagram depicting a method by which a system of this invention interprets operations structures in a test slot.

Finally, the process associated with interpreting an operations structure (step 128 of FIG. 5) will be detailed in FIG. 9. The process begins at 210 and in a step 212 determines which operation is specified by the operations structure. The particular operation is specified by the opcode in the operations structure. Next, a decision step 216 determines whether the operation is a generate processor instruction text operation or an interpreter control operation. If decision step 216 determines that operation is a processor control operation, a decision step 218 determines whether to switch contexts.

Note that unless specified in the test generator parameter structure, each test generator, when randomly selected, is allocated a random context (from a list of up to 8 preselected random contexts register windows). Therefore, the test interpreter checks to see if the context it was last in (for the generation of the last processor instruction text) is the same as the one for the test generator in the currently selected slot. If it is not, a step 220 then it automatically generates the code to get to the context for this test generator before generating its processor instruction text. The same decision process is used for getting to the proper register window as shown in decision step 232 and process step 234. Note that this changing of the context and register window is architecture specific for the SPARC V8 type processor.

Regardless of whether or not the register window is to be switched, the generate instruction text operation is next decoded in a step 222. Thereafter, a decision step 224 determines whether the generate instruction text operation specifies a virtual register. If so, the test interpreter allocates a corresponding physical register in a step 228 as described above. Regardless of whether not the current operation specifies a virtual register, a step 230 generates the appropriate processor instruction text for use in the output file. Thereafter the process is concluded in step 240.

If decision step 216 determines that the current instruction is an interpreter control operation, a step 236 processes that operation. Thereafter, the process is concluded at 240. As noted above, there can be variety of interpreter control operations may be provided by the test generators. Some of these have been implemented and are specified below.

COMMENT outputs text with the necessary tabbing and leading character to designate an instruction comment.

ID sets a unique identifier for a test generation. This id value is used for register allocation identification and for output code comments to identity what line of code belongs to what test during instruction shuffling.

TESTSWITCH forces a switch in the test slot whose operations structures are currently being processed.

WAIT instructions cause the current test to not have another instruction generated until a fixed or random number of instructions form other tests has expired. If a parameter "wait type" is FIXED then a "timefixed" field specifies the number of instructions to wait. If the wait type is RANDOM then a random number is chosen. If all concurrent tests end up waiting, then one test is automatically released before the fixed or random number of instructions have been generated to break the deadlock.

DEFERTEST causes the entire state of a test to be suspended into a "defer" queue to be reactivated later. This instruction should only be used if all registers currently allocated within a given test have been released, in order to not tie up registers for long intervals. When a new test is selected for generation, a random selection will be made between generating a new test or reactivating a test currently on the defer queue. The queue works in a first in first out order so the more tests which are deferred, the longer the delay interval between test defer and reactivation.

ATOMICON unconditionally enables atomic mode. Once the atomic bit is set, instructions from the test will be generated exclusively without any test switching until an ATOMICOFF instructions is interpreted.

RANDOM-ATOMICON will randomly decide to enable the atomic bit for instruction generation in the test which enabled it. If atomic is enabled then it operates as indicated in ATOMICON. This can be used for load and store sequences which can have operations tightly grouped or dispersed with other test instructions.

ATOMICOFF disables atomic mode for the test which issued it and causes a test switch.

RELEASE causes a register allocated to a specified test id, in a specific register window to be released. After a virtual register is released its corresponding physical register cannot be recovered.

RELEASEFP causes a floating point register allocated to a specified test id to be released. After a virtual register is released its corresponding physical register cannot be recovered.

GETLABEL will copy a unique label into a buffer pointed to by an instructions string pointer. This is used for creating unique branch labels.

PUTLABEL outputs a text label to the instruction output stream. This is used for creating a branch target label.

NEXT examines a runtime variable whose pointer is passed in an instructions parameter list and compares it to zero and non-zero. If the value at the pointer is nonzero and an associated flag is set to TRUE or the value at the pointer is zero and the flag is set to FALSE, then the current test will be incremented/decremented by number provided in the count parameter. If the above conditions are not met then the test is incremented by 1 as usual. This instruction allows the instruction generator to skip (branch) around other programmed instructions, so as to prevent them from being generated based on runtime conditions.

MODE toggles the test interpreter internal test generation mode between supervisor and user. This would normally be used in a dedicated test whose purpose is to randomly change the current operating mode of the hardware. Although all MODE really does is change the state of a flag within test interpreter, by using the EXEC instruction and NEXT instructions, a test generator can have the instruction generator conditionally generate trap instructions prior to generating privilege instructions based on the current mode. This allows a test generator to be written in such a way that trap instructions (trap to supervisor mode and trap back to user mode) will not be generated prior to and after privilege instructions if the mode is already supervisor, unless that condition is expressly desired.

RESERVEOUTPUT will reserve a block of output instructions and advances the output pc (program counter). The value of the pc at the start of the reserved block is subsequently used by INSERTOUTPUT when code is to be inserted to the reserved block. This instruction is generally used to reserve an area to be branched into by a test which will subsequently create a branch and code to fill into the reserved block.

INSERTOUTPUT takes the pc value returned from RESERVEOUTPUT and changes the output pc to that value and enables atomic mode for the current test. Instructions will begin to be generated, uninterrupted, into the reserved area. This is generally used for branch targets.

APPENDOUTPUT This instruction will change the output pc back to the point before code insertion was started and will disable atomic mode for this test. This is used after code insertion via INSERTOUTPUT is completed in order to resume normal code generation.

EXEC will execute a user provided or system provided routine during execution of the operations structures. The parameters provided with the instructions are passed to the routine which will define those parameters using the desired types in order to force proper parameter type casting. The parameters can be integers or any pointers.

DONE indicates that the current set of test generator instructions is completed. All instructions following DONE are ignored.

Although the foregoing invention has been described in some detail for purposes of clarity of understanding, it will be apparent that certain changes and modifications may be practiced within the scope of the appended claims. For instance, although the specification has described a test interpreter which switches slots in a round robin order, other test interpreter switching mechanisms can be used as well. For example, an interpreter that switches slots randomly may also be used. In addition, the reader will understand that the operations contained in the test slots herein can be provided by methods other than executing test generators. For example, some slots may remain filled with default instructions which are reinterpreted a set number of times. Still further, to the extent that the system of this invention is used to test microprocessors, those microprocessors can have a variety of architectures and be provided by a variety of vendors. For example, the system can generate test instructions for reduced instruction set (RISC) microprocessors, complex instruction set (CISC) microprocessors, etc.

What is claimed is:

1. A system for outputting a sequence of processor instructions for execution on a target processor, the system comprising:

at least two executable test generators which when executed specify particular processor instructions to be used in said sequence of processor instruction for execution on said target processor; and a test interpreter which at least partially shuffles the particular processor instructions from said at least two independent test generators and generates said sequence of processor instructions for execution on said target processor such that sequence includes two of said particular processor instructions from one test generator which are separated from one another by one or more particular processor instructions from the other test generator.

2. The system of claim 1 wherein the test interpreter shuffles blocks of particular processor instructions from the test generators such that the sequence of processor instructions includes blocks of particular processor instructions from one test generator separated from one another by at least one block of particular processor instructions from one or more other test generators.

3. The system of claim 1 wherein said test generator when executed programs interpreter control operations which control how said test interpreter generates the sequence of processor instructions.

4. The system of claim 3 wherein said interpreter control operations include operations which specify running the processor in either a supervisor mode which is available to a limited class of users or a user mode which is available to all users of the processor.

5. The system of claim 3 wherein said interpreter control operations include operations which cause a defined sequence of processor instructions to be included back-to-back in said sequence of instructions.

6. The system of claim 3 wherein said interpreter control operations include operations which cause the random allocation of physical registers of said target processor in the sequence of processor instructions for execution on said target processor.

7. The system of claim 3 wherein said interpreter control operations include operations which simulate expected results of executing the sequence of processor instructions on said target processor.

8. The system of claim 3 wherein said interpreter control operations include operations which simulate expected cache activity resulting from executing the sequence of processor instructions on said target processor.

9. A method for generating a sequence of processor instructions for execution on a target processor, the method comprising the following steps:

provetting at least a first and a second executable test generator, each of which includes code containing interface calls, at least some of which specify particular processor instructions to be used in said sequence of processor instructions for execution on said target processor;

executing one of said test generators such that said interface calls are used to program information into a test interpreter at least a portion of said information specifying said particular processor instructions to be used in said sequence of processor instructions for execution on said target processor;

selecting operations from among operations provided from at least the first and the second test generators;

shuffling at least some of the particular processor instructions specified by the operations of said first and second test generators to generate said sequence of processor instructions for execution on said target processor; and outputting said sequence of processor instructions for execution on said target processor.

10. The method of claim 9 wherein the steps of selecting operations from a second test generator involves selecting the first test generator a second time.

11. The method of claim 9 wherein the steps of selecting operations from said first and second test generators includes randomly selecting test generators from among a group of designated test generators.

12. The method of claim 9 wherein at least some of the interface calls specify interpreter control operations for controlling the organization or content of instructions in said sequence of processor instructions for execution on said target processor.

13. The method of claim 9 wherein said step of executing one of said test generators includes the steps of programming information into operations structures allocated in slots of said test interpreter where they are selected for shuffling.

14. The method of claim 9 further comprising a step of randomly allocating physical registers for at least some of the particular processor instructions.

15. An apparatus for generating a sequence of processor instructions for execution on a target processor, the system comprising one or more executable test generators, each containing interface calls specifying processor instructions for use in generating the sequence of processor instructions for execution on the target processor;

a test interpreter having a plurality of test slots, each slot having holding operations structures for holding information provided by the interface calls from a single test generator;

an instruction generation element for interpreting operations in the operations structures of said plurality of slots; and a switching element for switching between test slots when the operations structures are being interpreted.

16. The apparatus of claim 15 further comprising a selection element for randomly selecting test generators to fill empty test slots.

17. The apparatus of claim 15 wherein the switching element includes a random test switcher which determines whether a new slot should be selected after an operations structure has been executed; and a round robin test switcher which causes slots to be switched in a round robin order.

18. A system for generating a file containing a sequence of processor instructions for performing design verification on a target processor, the system comprising:

at least two executable test generator which when executed program operations which specify particular processor instructions to be used in said sequence of processor instructions for execution on said target processor; and a test interpreter which at least partially shuffles the particular processor instructions from said at least two independent test generators and generates said sequence of processor instructions for execution on said target processor such that the sequence includes at least two of said particular processor instructions from the test generator which are separated from at least one other processor instruction, wherein said sequence of processor instructions are stored in said file.

19. The system of claim 18 wherein the test interpreter shuffles blocks of particular processor instrction from the test generators such that the sequence of processor instuctions includes blocks of particular processor instructions from one test generator separated from one another by at least one block of particular processor instructions from one or more other test generators.

20. The system of claim 18 wherein said test generator when executed programs interpreter control operations which control how said test interpreter generates the sequence of processor instructions.

21. The system of claim 20 wherein said interpreter control operations include operations which specify the processor in either a supervisor mode which is available to a limited class of users or a user mode which is available to all users of the processor.

22. The system of claim 20 wherein said interpreter control operations include operations which cause a defined sequence of processor instructions to be included back-to-back in said sequence of instuctions.

23. A computer readable medium containing program instructions for generating a sequence of processor instructions for performing design verification on a target processor, the instructions comprising the following steps:

providing one or more executable test generators, each of which includes code containing interface calls, at least some of which specify particular processor instructions to be used in said sequence of processor instructions for execution on said target processor;

executing one of said test generators such that said interface calls are used to program information into a test generator at least a portion of said information specifying said particular processor instructions to be used in said sequence of processor instructions for execution on said target processor;

shuffling said particular processor instructions to at least partially define said sequence of processor instructions for execution on said target processor; and outputting said sequence of processor instructions for execution on said target processor.

24. The computer readable medium of claim 23 wherein the steps of selecting operations from said first and second test generators includes randomly selecting test generators from among a group of designated test generators.

25. The computer readable medium of claim 23 wherein at least some of the interface calls specify interpreter control operations for controlling the organization or content of instructions in said sequence of processor instructions for execution on said target processor.

26. The computer readable medium of claim 23 wherein said step of executing one of said test generators includes the steps of programming information into operations structures allocated in slots of said test interpreter where they are selected for shuffling.

27. The computer readable medium of claim 23 further comprising a step of randomly allocating physical registers for at least some of the particular processor instructions.

* * * * *

UNITED STATES PATENT AND TRADEMARK OFFICE
CERTIFICATE OF CORRECTION

PATENT NO. : 5,572,666
DATED : November 5, 1996
INVENTOR(S) : Whitman

It is certified that error appears in the above-indentified patent and that said Letters Patent is hereby corrected as shown below:

```
Column 2, line 23, change "retorted" to --referred--
Column 5, line 61, change "front" to --from--
Column 11, line 23, change "Such/functions" to --Such functions--
Column 13, line 65, change "." to --,--
Column 16, line 37, change "instruction" to --instructions--
Column 17, line 60, change "one" to --two--
Column 18, line 19, change "generator" to --generators--
Column 18, line 20, delete "program operation which"
```

Signed and Sealed this

Thirteenth Day of May, 1997

*Attest:*

BRUCE LEHMAN

*Attesting Officer*   *Commissioner of Patents and Trademarks*